(12) United States Patent
Akazawa

(10) Patent No.: US 9,401,462 B2
(45) Date of Patent: Jul. 26, 2016

(54) LIGHT EMITTING DEVICE EXHIBITING EXCELLENT HEAT RESISTANCE AND GOOD COLOR REPRODUCIBILITY THROUGH FLUORESCENT MATERIAL ARRANGEMENT

(71) Applicant: Nichia Corporation, Anan-shi, Tokushima (JP)

(72) Inventor: Yuji Akazawa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 5 days.

(21) Appl. No.: 14/581,015

(22) Filed: Dec. 23, 2014

(65) Prior Publication Data

US 2015/0189703 A1    Jul. 2, 2015

(30) Foreign Application Priority Data

Dec. 27, 2013    (JP) ................................. 2013-272688

(51) Int. Cl.
*H01L 33/00*    (2010.01)
*H01L 33/50*    (2010.01)
*H01L 33/52*    (2010.01)

(52) U.S. Cl.
CPC ............. *H01L 33/508* (2013.01); *H01L 33/504* (2013.01); *H01L 33/52* (2013.01); *H01L 2224/16225* (2013.01); *H01L 2224/32225* (2013.01); *H01L 2224/48091* (2013.01); *H01L 2224/48137* (2013.01); *H01L 2224/48247* (2013.01); *H01L 2224/48257* (2013.01); *H01L 2224/73204* (2013.01); *H01L 2224/78301* (2013.01); *H01L 2224/8592* (2013.01);

(Continued)

(58) Field of Classification Search
CPC ................. H01L 33/502; H01L 33/50; H01L 2251/5315; H01L 2224/49107; H05B 33/12; F21Y 2101/02
USPC ................................... 313/498–512
See application file for complete search history.

(56) References Cited

U.S. PATENT DOCUMENTS

| | | | |
|---|---|---|---|
| 7,250,715 B2 * | 7/2007 | Mueller | C09K 11/0883 313/485 |
| 7,655,486 B2 * | 2/2010 | Thompson | C08L 83/04 257/E25.032 |
| 7,859,002 B2 * | 12/2010 | Nagai | H01L 33/54 257/98 |

(Continued)

FOREIGN PATENT DOCUMENTS

JP    2005-302920    10/2005
JP    2006-190813    7/2006

(Continued)

*Primary Examiner* — Tracie Y Green
(74) *Attorney, Agent, or Firm* — Foley & Lardner LLP

(57) ABSTRACT

A light emitting device comprising: a base; a light emitting element arranged on a surface of the base; a first resin layer arranged to surround a side portion of the light emitting element and to be spaced apart from the side portion; and a second resin layer arranged on the surface of the base, the second resin layer being present at least on a top of the light emitting element, on a top of the first resin layer, and in an area between the light emitting element and the first resin layer, wherein the first resin layer comprises a light transmissive resin and a first fluorescent material, wherein the second resin layer comprises a light transmissive resin and a second fluorescent material, and wherein the second fluorescent material exhibits higher heat resistance than that of the first fluorescent material.

30 Claims, 6 Drawing Sheets

(52) U.S. Cl.
CPC . *H01L2224/85181* (2013.01); *H01L 2924/181* (2013.01)

(56) References Cited

U.S. PATENT DOCUMENTS

| | | | |
|---|---|---|---|
| 7,923,928 B2* | 4/2011 | Kasakura | C09K 11/0883 313/498 |
| 8,916,887 B2* | 12/2014 | Kim | H01L 33/50 257/88 |
| 2009/0206353 A1 | 8/2009 | Okazaki | |
| 2010/0019247 A1* | 1/2010 | Joichi | H01L 33/32 257/76 |
| 2011/0018022 A1* | 1/2011 | Okabe | H01L 33/405 257/98 |
| 2011/0284904 A1 | 11/2011 | Okazaki | |
| 2012/0235192 A1* | 9/2012 | Lin | H01L 33/504 257/98 |
| 2013/0264937 A1* | 10/2013 | Sakuta | H01L 33/504 313/503 |
| 2014/0071689 A1* | 3/2014 | Yoon | H01L 33/54 362/296.01 |

FOREIGN PATENT DOCUMENTS

| | | |
|---|---|---|
| JP | 2007-184326 | 7/2007 |
| JP | 2007-184330 | 7/2007 |
| JP | 2009-170825 | 7/2009 |
| JP | 2013-182917 | 9/2013 |

\* cited by examiner

LIGHT EMITTING DEVICE EXHIBITING EXCELLENT HEAT RESISTANCE AND GOOD COLOR REPRODUCIBILITY THROUGH FLUORESCENT MATERIAL ARRANGEMENT

CROSS REFERENCE TO RELATED APPLICATION

The present application claims priority under 35 U.S.C. §119 to Japanese Patent Application No. 2013-272688, filed Dec. 27, 2013.

BACKGROUND OF THE INVENTION

1. Field of the Invention

The present disclosure relates to a light emitting device.

2. Description of the Related Art

Conventionally, a light emitting device is known which is configured to emit white light by use of a light emitting element emitting blue light and a fluorescent material excited by absorbing a part or all of the blue light to emit light with longer-wavelength. In such light emitting device, it is demanded to uniform color tone of the white light emission and to improve light intensity of the white light emission.

For example, JP 2007-184326 A describes a thin light emitting diode lamp, wherein a blue light emitting diode chip is mounted on an inner bottom surface of a grooved concave portion provided on a top surface of a main body of the lamp, wherein a red photoconversion layer comprising red fluorescent material is provided to cover the diode chip, and wherein a green photoconversion layer comprising green fluorescent material is arranged such that blue light pass through the green photoconversion layer. In this thin light emitting diode lamp, the thickness of the red photoconversion layer at both right and left side surfaces extending across the grooved concave portion among the side surfaces of the blue light emitting diode chip is set to be thicker than the thickness of the red photoconversion layer at both right and left side surface extending in a longitudinal direction of the grooved concave portion among the side surfaces of the blue light emitting diode chip. Accordingly, the red photoconversion layer and the green photoconversion layer can uniform color tone of the white light emission in each place in this thin light emitting diode lamp. It further describes that light intensity of white light emission can be improved by providing a light transmission layer between the red photoconversion layer and the green photoconversion layer in this thin light emitting diode lamp, the light transmission layer comprising either of the red fluorescent material or the green fluorescent material, or comprising neither the red fluorescent material nor the green fluorescent material, or comprising a small amount of the red fluorescent material and/or the green fluorescent material.

JP 2007-184330 A describes a light emitting device configured such that blue light emitted from a blue light emitting diode chip transmits a red photoconversion layer comprising red fluorescent material, and then transmits a green photoconversion layer comprising green fluorescent material. It also describes that in this light emitting device, light intensity of white light emission can be improved by providing at the boundary of the red photoconversion layer and the green photoconversion layer a light transmission layer comprising either of the red fluorescent material or the green fluorescent material, or comprising neither the red fluorescent material nor the green fluorescent material, or comprising a small amount of the red fluorescent material and/or the green fluorescent material.

SUMMARY OF THE INVENTION

However, a fluorescent material may exhibit lower heat resistance depending on its composition and its kind. Therefore, when selecting the fluorescent material in view of the desired color reproducibility and light extraction efficiency, degradation of fluorescent materials caused by heat generated from a light emitting element may become a problem.

The present disclosure is made in view of the above-mentioned circumstances, and it provides a light emitting device exhibiting excellent heat resistance and good color reproducibility.

The present inventors have found that heat resistance of a light emitting device can be improved by the arrangement of a first resin layer comprising a fluorescent material with lower heat resistance to surround a side portion of a light emitting element, and by the arrangement of a second resin layer comprising a fluorescent material with higher heat resistance at least on the top of the light emitting element and on the top of the first resin layer. And thus, the present invention has been completed.

A first aspect of the present invention provides a light emitting device comprising:

a base;

a light emitting element arranged on a surface of the base;

a first resin layer arranged on the surface of the base to surround a side portion of the light emitting element and to be spaced apart from said side portion; and a second resin layer arranged on the surface of the base, the second resin layer being present at least on a top of the light emitting element, on a top of the first resin layer, and in an area between the light emitting element and the first resin layer, wherein the first resin layer comprises a light transmissive resin and a first fluorescent material excited by at least part of light emitted by the light emitting element to emit light, wherein the second resin layer comprises a light transmissive resin and a second fluorescent material excited by at least part of light emitted by the light emitting element to emit light, and wherein the second fluorescent material exhibits higher heat resistance than that of the first fluorescent material.

A second aspect of the present invention provides a light emitting device comprising:

a base having a concave portion;

a light emitting element arranged on a bottom surface of the concave portion;

a first resin layer arranged to surround a side portion of the light emitting element; and a second resin layer arranged on a surface of the base, the second resin layer being present at least on a top of the light emitting element and on a top of the first resin layer, wherein the first resin layer comprises a light transmissive resin and a first fluorescent material excited by at least part of light emitted by the light emitting element to emit light, wherein the second resin layer comprises a light transmissive resin and a second fluorescent material excited by at least part of light emitted by the light emitting element to emit light, wherein the first fluorescent material is arranged on a sidewall side of the concave portion in larger amount than on a side of the light emitting element, and wherein the second fluorescent material exhibits higher heat resistance than that of the first fluorescent material.

The embodiments of the present invention exhibit excellent heat resistance and good color reproducibility since it has the above-mentioned features.

DETAILED DESCRIPTION OF THE EMBODIMENTS

Figure 1A:
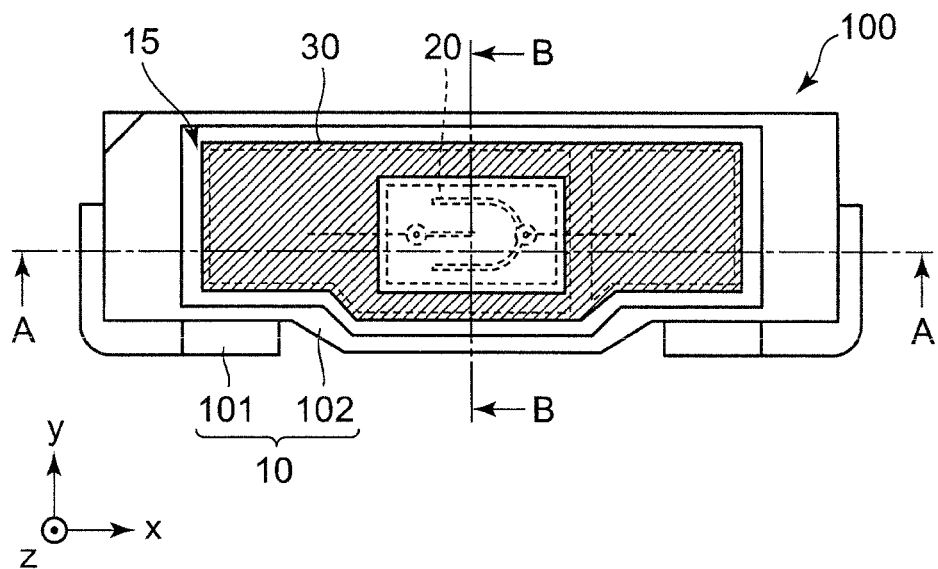
FIG. 1A shows a schematic top view of a light emitting device according to a first embodiment of the present invention.

Hereinafter, embodiments of the present invention will be described with reference to the drawings. The embodiments described below are aimed at embodying technical ideas of the present invention, and the present invention is not limited to the following embodiments. Sizes, relative positions and the like of the members indicated in the respective drawings may be exaggerated in order for the explanation to be clear. The "x" direction, the "y" direction and the "z" direction in the drawings are also referred to as "transversal" direction, "lengthwise" direction and "vertical" or "height (thickness)" direction, respectively.

First Embodiment

Figure 1B:
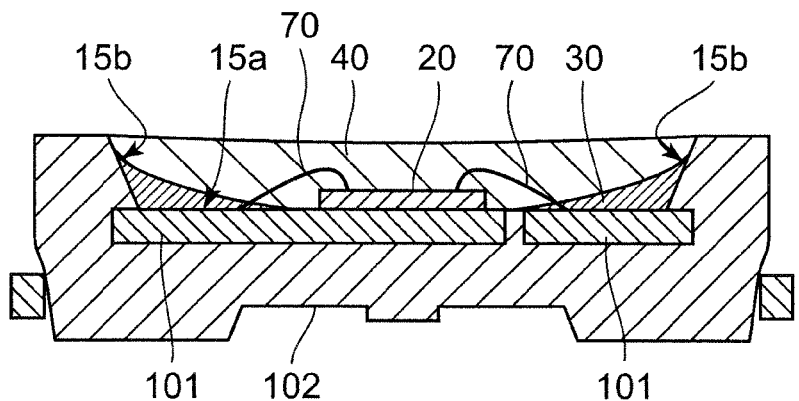
FIG. 1B shows a schematic cross-sectional view along a line A-A in FIG. 1A.
Figure 1C:
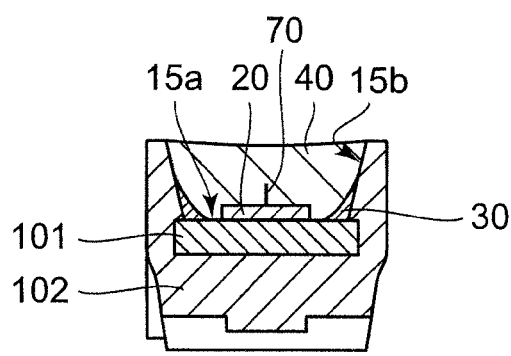
FIG. 1C shows a schematic cross-sectional view along a line B-B in FIG. 1A.

FIG. 1A is a schematic top view of a light emitting device according to a first embodiment of the present invention, FIG. 1B is a schematic cross-sectional view along a line A-A in FIG. 1A, and FIG. 1C is a schematic cross-sectional view along a line B-B in FIG. 1A.

In the present embodiment, the light emitting device 100 comprises a base 10, a light emitting element 20, a first resin layer 30 comprising a first fluorescent material and a second resin layer 40 comprising a second fluorescent material.

The base 10 is a member to be a pedestal for the light emitting element 20 mounted thereon. The base 10 is composed of a pair of positive and negative lead frames 101 and a molding 102 formed integrally with the lead frames 101. The lead frames 101 are conductive members for providing power to the light emitting element 20. The molding 102 is a member for holding the lead frames 101.

The base 10 has a concave portion 15. By the term "concave portion," applicant means an inward hollowed portion that may have flat (straight) and/or rounded surfaces. In the present embodiment, a bottom surface 15a of the concave portion 15 is composed of a surface of the lead frames 101 and a surface of the molding 102. A sidewall surface 15b of the concave portion 15 is composed of the surface of the molding 102. Thus, in the present embodiment, the concave portion has a flat bottom surface 15a and flat sidewall surfaces 15b. However, the bottom surface 15a and/or the sidewall surface 15b may be curved; for example, the sidewall surface 15b may be curved instead of flat. The base 10 has the concave portion 15 in the present embodiment; however, the base 10 may be in the form of plate without any concave portion 15. Also, the sidewall surface 15b of the concave portion 15 may be formed of the lead frame(s).

The light emitting element 20 is arranged on the surface of the base 10. In the present embodiment, the light emitting element 20 is arranged on the bottom surface 15a of the concave portion 15 in the base 10. The light emitting element 20 is attached to the bottom surface 15a with an adhesive, and electrically-connected to the lead frames 101 by wires 70.

The first resin layer 30 is arranged on the surface of the base 10 (the bottom surface 15a of the concave portion 15) to surround a side portion of the light emitting element 20 and to be spaced apart from the side portion. The first resin layer 30 comprises a light transmissive resin and the first fluorescent material which is excited by at least part of light emitted by the light emitting element to emit light.

The second resin layer 40 is arranged on the surface of the base 10 (the bottom surface 15a of the concave portion 15). The second resin layer 40 is present at least on the top of the light emitting element 20, on the top of the first resin layer 30, and in the area between the light emitting element 20 and the first resin layer 30. The second resin layer 40 comprises a light transmissive resin and the second fluorescent material which is excited by at least part of light emitted by the light emitting element to emit fluorescence.

The second fluorescent material exhibits higher heat resistance than that of the first fluorescent material. As used herein, "higher heat resistance" means that a fluorescent material powder shows a smaller change in its color tone after heating. In other words, when two kinds of fluorescent materials are compared with each other, one showing a smaller change in its color tone shall be a fluorescent material exhibiting higher heat resistance. The light emitting element 20 generates heat and light. The generation of heat and light is remarkable especially on the upper surface of the light emitting element 20. In the present embodiment, the first fluorescent material has a fluorescence peak wavelength located at the longer wavelength side than that of the second fluorescent material. For example, the first fluorescent material has a fluorescence peak wavelength in red region of the wavelength from 610 nm to 750 nm, and the second fluorescent material has a fluorescent peak wavelength in green region of the wavelength from 490 nm to 570 nm.

In the present embodiment, the first resin layer 30 comprising the first fluorescent material is arranged to surround the side portion of the light emitting element 20 and to be spaced apart from the side portion, and is not present on the top of the light emitting element 20. On the other hand, the second resin layer 40 comprising the second fluorescent material is arranged to cover the light emitting element 20 and the first resin layer 30, and is present at least on the top of the light emitting element 20, on the top of the first resin layer 30, and in the area between the light emitting element 20 and the first resin layer 30. Such arrangement of the first resin layer 30 and the second resin layer 40 allows the first fluorescent material exhibiting relatively-low heat resistance to be present apart from the side portion of the light emitting element 20, and allows the first fluorescent material not to be present on the top of the light emitting element 20 where the generation of heat and light is especially significant, so that the degradation of the first fluorescent material can be suppressed. In contrast, the second fluorescent material exhibiting relatively-high heat resistance may be present on the top of the light emitting element 20 and between the light emitting element 20 and the first resin layer 30. In addition, the second fluorescent material preferably exhibits higher light resistance than that of the first fluorescent material. This can suppress the degradation of the first fluorescent material due to the light emitted by the light emitting element.

In addition, the second fluorescent material preferably exhibits higher moisture resistance than that of the first fluorescent material. The first resin layer does not contact directly with an external environment by the arrangement of the second resin layer 40 comprising the second fluorescent material exhibiting relatively-high moisture resistance on the top of the first resin layer 30 comprising the first fluorescent material exhibiting relatively-low moisture resistance. Therefore, the degradation of the first fluorescent material due to moisture which can penetrate from the external environment can be suppressed.

Furthermore, since the light emitting device 100 has the above-mentioned configuration, the absorption of the light emitted by the second fluorescent material into the first fluorescent material can be suppressed in the light emitting device 100 even when the emission wavelength of the second fluorescent material overlaps at least partly with the absorption spectrum of the first fluorescent material. Hereinafter, a mechanism of light emission in the light emitting device 100 according to the present embodiment will be described with reference to FIG. 2. The light emitted from the light emitting element 20 is also referred to as "primary light," and the fluorescence emitted from the fluorescent materials (the first and the second fluorescent material) is also referred to as "secondary light."

Figure 2:
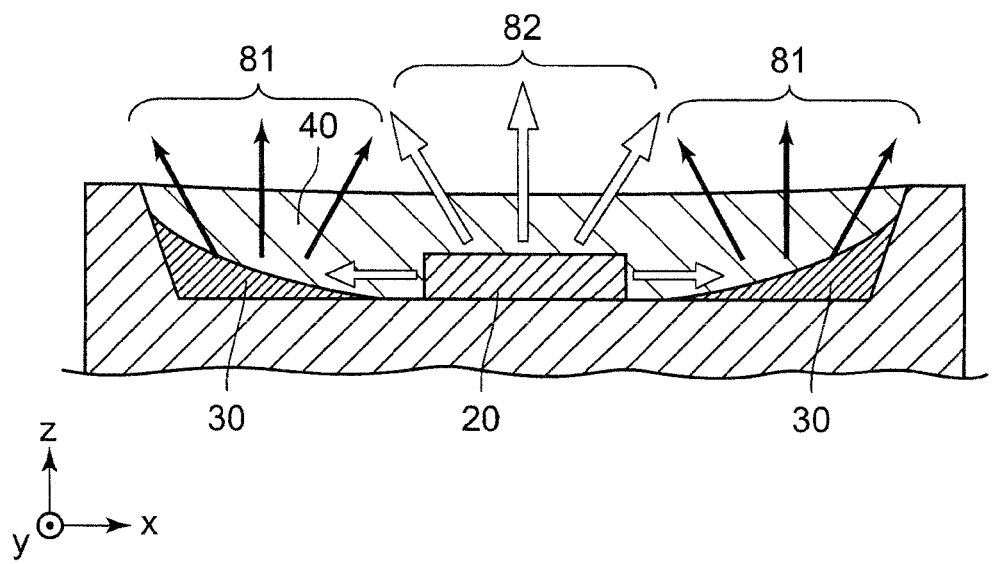
FIG. 2 shows a schematic view representing a mechanism of light emission in the light emitting device according to the first embodiment of the present invention.

As shown in FIG. 2, the light emitting element 20 emits light not only from its upper surface but also from its side surface. In many cases, the light intensity in upward direction of the light emitting element 20 is higher than the light intensity in lateral direction, and the light emitting element 20 has maximum light intensity in its directly upward direction. In particular, when the light emitting element 20 is in the form of a rectangular parallelepiped, it tends to have such light intensity distribution. The primary light emitted from the light emitting element 20 has high directivity compared to the secondary light emitted from the first resin layer 30 (first fluorescent material).

In the light emitting device 100, only the second resin layer 40 comprising the second fluorescent material is present on the top of the light emitting element 20. Therefore, the secondary light (fluorescence) 82 generated by excitation of the second fluorescent material by means of at least part of the primary light emitted from the top of the light emitting element 20 is poorly absorbed by the first fluorescent material, and is emitted readily to the outside of the light emitting device 100. On the other hand, at least part of the primary light emitted from the side portion of the light emitting element 20 is firstly converted into the secondary light (fluorescence) by the second fluorescent material in the second resin layer 40 which is present in the area between the light emitting element 20 and the first resin layer 30. And then, the first fluorescent maternal in the first resin layer 30 is excited by at least part of the primary light emitted from the side portion of the light emitting element 20 and of the secondary light emitted from the second fluorescent material to generate the secondary light (fluorescence) 81. The directivity of the primary light is decreased by the conversion of the primary light component emitted in lateral direction from the light emitting element 20 into the secondary light in this manner, and thus, a light component toward the sidewall surface 15b of the concave portion 15 is decreased. Accordingly, a light component absorbed on the sidewall surface 15b of the concave portion and a light component passing through the sidewall surface 15b are reduced, and as a result, the secondary light 81 emitted from the first fluorescent material can be extracted efficiently above the light emitting device 100. As a whole, loss of light caused by the absorption of the fluorescence emitted from the second fluorescent material into the first fluorescent material can be minimized, and thus, excellent light extraction efficiency can be achieved.

Preferable configurations of the light emitting device 100 according to the present embodiment will be described below.

(Base 10)

The base 10 is composed of a pair of positive and negative lead frames 101 and the molding 102 formed integrally with the lead frames 101. The base 10 has the concave portion 15 in the present embodiment; however, the base 10 may be in a form of plate without any concave portion 15. When the base 10 has the concave portion 15, the light intensity in the anterior direction of the light emitting device 100 can be increased. When the base 10 is in the form of plate, the light emitting element 20 can be mounted easily. The shape and the dimension of the concave portion 15 is not particularly limited; for example, the depth of the concave portion 15 is preferably from 15 times to 100 times as much as the height (thickness) of the light emitting element such that the first resin layer 30 and the second resin layer 40 are arranged easily therein. In addition, the sidewall surface 15b of the concave portion is preferably, inclined so that opening area of the concave portion 15 is widened toward the top. This makes it easier for the first resin layer 30 dropped on the bottom surface 15a of the concave portion 15 to creep up along the sidewall surface 15b in a manufacturing process of the light emitting device described below so that the light emitting element 20 and the first resin layer 30 can be spaced apart easily from each other.

(Lead Frame 101)

The lead frames 101 may be formed of copper, iron, nickel, palladium, tungsten, chromium, aluminum, silver, gold, titanium or alloys thereof. The lead frames 101 may also be clad materials formed by bonding of dissimilar metals. In particular, copper or copper alloys are preferable in the light of heat radiation, and iron or iron alloys are preferable in the light of bonding reliability to the light emitting element. Among them, copper or copper-iron alloys are preferable since they exhibit higher heat radiation. The lead frames 101 can be prepared by the processing, for example, the pressing and/or the etching of metal plate(s) formed of the above-mentioned metals. The lead frames 101 may have a coat on at least part of the surface which is formed of silver, nickel, palladium, platinum, tin, gold, copper, rhodium or alloys thereof, silver oxide, oxides of silver alloys or the like.

(Molding 102)

The molding 102 may be formed of thermoplastic resins such as aliphatic polyamide resins, semi-aromatic polyamide resins, polyethylene terephthalate, polycyclohexane terephthalate, liquid crystal polymers, polycarbonate resins, syndiotactic polystyrenes, polyphenylene ether, polyphenylene sulfide, polyether sulfone resins, polyether ketone resins, polyarylate resins; thermosetting resins such as polybismaleimide triazine resins, epoxy resins, silicone resins, modified silicone resins, polyimide resins, polyurethane resins. The molding 102 may comprise fillers and/or color pigments in addition to these resins. Alternatively, the molding 102 may be formed of glass, ceramics or the like. As a method for forming the molding 102, for example, insert molding, injection molding, extrusion molding or transfer molding can be used.

(Light Emitting Element 20)

The light emitting element 20 is arranged on the bottom surface 15a of the concave portion 15 in the base 10. The light emitting element 20 is attached to the bottom surface 15a with the adhesive, and electrically-connected to the lead frames 101 by the wires 70. As the light emitting element 20, for example, semiconductor light emitting elements such as LED elements can be used. The light emitting element 20 usually comprises a light-transmissive substrate, semiconductor layers laminated on the light-transmissive substrate, and a pair of positive and negative electrodes provided on the semiconductor layers. The light emitting element 20 may emit ultraviolet light or visible light. When used in the light emitting devices generating white light, the light emitting element is preferably a blue light emitting element having emission wavelength preferably from 400 nm to 530 nm, more preferably from 420 nm to 490 nm. White light emitting device exhibiting excellent color reproducibility can be obtained by use of the blue light emitting element in combination with red fluorescent material as the first fluorescent material and green and/or yellow fluorescent materials as the second fluorescent material as described below. As the blue light emitting element, nitride semiconductor ($In_xAl_yGa_{1-x-y}N$, $0 \leq x$, $0 \leq y$, $x+y \leq 1$)-based light emitting elements which can efficiently excite fluorescent materials are particularly preferable. One light emitting element 20 may be mounted on one light emitting device 100, or a plurality of light emitting elements may be mounted on one light emitting device 100. The arrangement of the light emitting element(s) 20 on the surface of the base 10 (the bottom surface 15a of the concave portion 15) is not particularly limited, and the arrangement can be set appropriately depending on the intended light distribution property and the like. When a plurality of light emitting elements 20 are arranged on the surface of the base 10, the respective light emitting elements 20 may be connected in series or in parallel by the conductive member(s) of the base 10 or wire(s) 70.

(Wire 70)

The wires 70 are members for electrically-connecting the electrodes of the light emitting element 20 to the conductive members (the lead frames 101, interconnections 121 or the like) of the base 10. Metal wires of gold, copper, silver, platinum, aluminum, or alloys thereof can be used as the wires 70. In particular, gold wires having less incidence of fracture due to stress from covering member(s) and exhibiting excellent thermal resistance and the like are preferable for the wires 70. Alternatively, at least surface of the wires 70 may be composed of silver to improve the light extraction efficiency.

(Adhesive)

The adhesive is a member for securing the light emitting element 20 to the base 10. As the adhesive, insulating adhesives or conductive adhesives can be chosen appropriately depending on the intended use. Epoxy resins, silicone resins, polyimide resins, or modified resins thereof and hybrid resins thereof or the like can be used as the insulating adhesives. Conductive pastes of silver, gold, palladium or the like, solders such as tin-bismuth-based solders, tin-copper-based solders, tin-silver-based solders and gold-tin-based solders and the like, or brazing materials of low melting point metals or the like can be used as the conductive adhesives.

(First Resin Layer 30)

The first resin layer 30 comprises the light transmissive resin and the first fluorescent material excited by at least part of light emitted by the light emitting element to emit fluorescence.

(Light Transmissive Resin)

The light transmissive resin is not particularly limited, as long as it is a material having electrically insulating property, capable of transmitting the light emitted from the light emitting element 20, and having flowability before solidification. Transmittance of the light transmissive resin is preferably 70% or more. The light transmissive resin includes, for example, silicone resins, silicone modified resins, epoxy resins, phenol resins, polycarbonate resins, acryl resins, TPX resins, polynorbornene resins or hybrid resins comprising one or more these resins and the like. Among them, silicone resins are preferable because they exhibit excellent heat resistance and light resistance, and their contraction in volume after solidification is low.

(First Fluorescent Material)

The first fluorescent material is a fluorescent material excited by at least part of light emitted by the light emitting element 20 to emit light. It has a fluorescence peak wavelength located at the longer wavelength side than the fluorescence peak wavelength of the second fluorescent material described below. In the case of the light emitting device emitting white light, the first fluorescent material is preferably a red fluorescent material having an emission peak wavelength in red region of wavelength from 610 nm to 750 nm. White light emitting device exhibiting excellent color reproducibility can be obtained by use of the red fluorescent material as the first fluorescent material in combination with the blue light emitting element described above and green and/or yellow fluorescent materials as the second fluorescent material described below. For example, SCASN-based fluorescent materials such as $(Sr, Ca)AlSiN_3$:Eu, CASN-based fluorescent materials such as $CaAlSiN_3$:Eu, $SrAlSiN_3$:Eu fluorescent materials or KSF-based fluorescent materials such as $K_2SiF_6$:Mn can be used as the red fluorescent material. Above-mentioned fluorescent materials may be used alone, or two or more of the above-mentioned fluorescent material may be used in mixture. Preferably, the red fluorescent material is $K_2SiF_6$:Mn fluorescent material. The color reproduction range can be broadened by use of $K_2SiF_6$:Mn fluorescent material having narrower emission spectrum as the first fluorescent material among above-mentioned materials.

The content of the first fluorescent material in the first resin layer 30 is preferably from 10 phr to 100 phr, more preferably from 60 phr to 100 phr relative to the content of the light transmissive resin. The target color tone is achieved easily by the content of the first fluorescent material being 10 phr or more. The target color tone is achieved further easily by the content of the first fluorescent material being 60 phr or more. The first resin layer is formed easily by the content of the first fluorescent material being 100 phr or less. Preferably, the first fluorescent material is evenly-distributed in the first resin layer 30. The light emission of the light emitting device 100 can be adjusted to uniform color tone by the even distribution of the first fluorescent material.

Preferably, the first resin layer 30 does not substantially comprise the second fluorescent material described below.

Occurrence of the loss of light caused by the absorption of a part of the light emitted from the second fluorescent material into the first fluorescent material can be suppressed by the first resin layer 30 not substantially comprising the second fluorescent material. As used herein, the wording "resin layer (the first resin layer 30 and the second resin layer 40) does not substantially comprise fluorescent material (the first fluorescent material and the second fluorescent material)" means that the content of the fluorescent material(s) in the resin layer is 10 phr or less.

The first resin layer 30 may further comprise additives such as fillers in addition to the above-mentioned light transmissive resin and the first fluorescent material.

The first resin layer 30 is arranged on the surface of the base 10 to surround the side portion of the light emitting element 20 and to be spaced apart from the side portion. The first resin layer 30 is not present on the top of the light emitting element 20. The degradation of the first fluorescent material contained in the first resin layer 30 due to heat and light can be suppressed by the arrangement of the first resin layer 30 in this manner.

The first resin layer 30 preferably contacts with the sidewall surface 15b of the concave portion 15. This allows the first resin layer 30 dropped on the bottom surface 15a of the concave portion 15 to be pulled by the sidewall surface 15b, and thus, an interspace between the light emitting element 20 and the first resin layer 30 can be formed easily. In addition, an upper surface of the first resin layer 30 is preferably curved. The height (thickness) of the first resin layer 30 from the surface of the base 10 (the bottom surface 15a of the concave portion 15) is preferably increased from the side close to the center of the concave portion 15 toward the sidewall surface 15b. This enables an amount of the first fluorescent material present on the side close to the sidewall surface 15b to be more than the amount of the first fluorescent material present on the side close to the light emitting element 20. The upper surface of the first resin layer 30 contacts with the surface of the base 10 (the bottom surface 15a of the concave portion 15) at the side close to the center of the concave portion 15. This makes it easy to radiate the heat in the first resin layer and the first fluorescent material out of the base 10. In addition, the degradation due to moisture penetrating from the upper surface of the concave portion can be suppressed by the arrangement of the first resin layer on the bottom surface 15a side of the concave portion 15.

The distance between the light emitting element 20 and the first resin layer 30 in a direction parallel to the surface of the base 10 (the bottom surface 15a of the concave portion 15) is preferably 5 μm or more, more preferably 10 μm or more, and preferably 1000 μm or less, more preferably 800 μm or less, further preferably 500 μm or less. The degradation of the first fluorescent material contained in the first resin layer 30 due to heat or light can be suppressed efficiently by the distance between the light emitting element 20 and the first resin layer 30 being 5 μm or more. When the distance between the light emitting element 20 and the first resin layer 30 is 10 μm or more, the degradation due to heat or light can be further suppressed. Loss of light caused by the absorption of the fluorescence emitted from the second fluorescent material present in the area between the light emitting element 20 and the first resin layer 30 into the first fluorescent material in the first resin layer 30 can be sufficiently reduced by the distance between the light emitting element 20 and the first resin layer 30 being 1000 μm or less. The loss of light can be further reduced by the distance between the light emitting element 20 and the first resin layer 30 being 800 μm or less, further preferably 500 μm or less. When the surface of the first resin layer 30 is curved as shown in FIG. 1B, the distance between the light emitting element 20 and the first resin layer 30 means a closest distance between the light emitting element 20 and the first resin layer 30 (in the case of FIG. 1B, the distance is the distance on the bottom surface 15a of the concave portion 15).

A height of the upper end of the first resin layer 30 from the surface of the base 10 (the bottom surface 15a of the concave portion 15) is preferably less than or equal to a height of the upper end of the light emitting element 20 from the surface of the base 10 (the bottom surface 15a of the concave portion 15). By setting the height of the first resin layer 30 low enough in this manner, the degradation of the first fluorescent material due to heat and light generated from the upper surface of the light emitting element 20 can be further suppressed. Furthermore, by setting the height of the first resin layer 30 low enough in this manner, the degradation of the first fluorescent material due to moisture which can penetrate from the external environment through the upper surface of the light emitting device 100 can be further suppressed. The height of the upper end of the first resin layer 30 from the surface of the base 10 (the bottom surface 15a of the concave portion 15) is more preferably less than or equal to the height of the lower end of a luminescent layer in the light emitting element 20 from the surface of the base 10 (the bottom surface 15a of the concave portion 15), and further preferably less than or equal to the height of the upper end of the substrate in the light emitting element 20 from the surface of the base 10 (the bottom surface 15a of the concave portion 15). By setting the height of the first resin layer 30 further low in this manner, the degradation of the first fluorescent material due to light, heat and moisture can be further efficiently suppressed.

The first resin layer 30 may be present throughout the region from the bottom surface 15a to the sidewall surface 15b of the concave portion 15 as shown in FIG. 1B and FIG. 1C. Such configuration can prevent the primary light emitted laterally from the light emitting element 20 from being absorbed by the sidewall surface 15b of the base 10, and/or from passing through the sidewall surface 15b, and as a result, the light extraction efficiency can be improved. Also, such configuration can further promote the conversion of the primary light emitted laterally from the light emitting element 20 into the secondary light by the first fluorescent material. In terms of the suppression of the degradation of the first fluorescent material due to moisture which can penetrate from the external environment, it is preferable to set the height of the first resin layer 30 from the surface of the base 10 low enough. However, in terms of the improvement of the light extraction efficiency and the improvement of the wavelength conversion efficiency as described above, the first resin layer 30 preferably reaches a level higher than the upper surface of the light emitting element 20 at the sidewall surface 15b of the concave portion 15. The height of the first resin layer 30 can be adjusted appropriately based on the above-mentioned matters depending on the intended use.

(Second Resin Layer 40)

The second resin layer 40 comprises a light transmissive resin and a second fluorescent material excited by at least part of light emitted by the light emitting element to emit light. As the light transmissive resin for the second resin layer 40, similar resins to the light transmissive resin for the first resin layer 30 can be used. The second resin layer 40 may further comprise additives such as fillers in addition to the light transmissive resin and the second fluorescent material.

(Second Fluorescent Material)

The second fluorescent material is a fluorescent material excited by at least part of light emitted by the light emitting element 20 to emit light, and has an emission peak wavelength located at the shorter wavelength side than the emission peak wavelength of the first fluorescent material. The second fluorescent material exhibits higher heat resistance than that of the first fluorescent material, and more preferably exhibits higher light resistance and/or higher moisture resistance than those of the first fluorescent material. In the case of the light emitting device for emitting white light, the second fluorescent material is preferably a green fluorescent material having an emission peak wavelength in green region of wavelength from 490 nm to 570 nm and/or a yellow fluorescent material having an emission peak wavelength in yellow region of wavelength from 570 nm to 590 nm. White light emitting device exhibiting excellent color reproducibility can be obtained by use of the green and/or yellow fluorescent materials as the second fluorescent material in combination with the blue light emitting element and the red fluorescent material as the first fluorescent material described above.

As the green fluorescent material, for example, chlorosilicate fluorescent materials and β-sialon fluorescent materials can be used. As the yellow fluorescent material, for example, yttrium-aluminum-garnet-based fluorescent materials (YAG-based fluorescent materials) and lutetium-aluminum-garnet-based fluorescent materials (LAG-based fluorescent materials) can be used. The green fluorescent materials and the yellow fluorescent materials can be used alone, or two or more of them can be used in mixture.

The second fluorescent material is preferably the green fluorescent material, more preferably one or more fluorescent materials selected from the group consisting of chlorosilicate fluorescent materials and β-sialon fluorescent materials. By the second fluorescent material being green fluorescent material, the color reproduction range can be broadened, and in addition, the color rendering property can be improved. By the second fluorescent material being one or more fluorescent materials selected from the group consisting of chlorosilicate fluorescent materials and β-sialon fluorescent materials, the emission spectrum of the second fluorescent material can be easily kept away from the excitation wavelengths of YAG-based fluorescent materials and LAG-based fluorescent materials. This can improve the light extraction efficiency of the light emitting device.

(Particle Size of the First Fluorescent Material and the Second Fluorescent Material)

The particle size of the first fluorescent material and the second fluorescent material is preferably from 2 µm to 40 µm. In particular, the particle size of the second fluorescent material which is to be arranged on the top of the light emitting element 20 is preferably smaller than the particle size of the first fluorescent material. In addition, when the base 10 has a concave portion 15 as in the first embodiment, the distance from the light emitting element 20 to the sidewall surface 15b of the concave portion 15 is preferably less than or equal to 20 times, particularly preferably less than or equal to 10 times as large as the particle size of the first fluorescent material. This improves the wavelength conversion efficiency of the fluorescent material, and thus, the amount of the first fluorescent material can be reduced even when the same color tone is desired. Decrease of the amount of the fluorescent material allows heat generation caused by the Stokes loss (lost energy upon excitation and upon light emission) in the fluorescent material to be reduced, and allows the degradation of the fluorescent material to be suppressed since the amount of the heat generation is decreased.

The content of the second fluorescent material in the second resin layer 40 is preferably from 10 phr to 60 phr, more preferably from 20 phr to 60 phr relative to the content of the light transmissive resin. The target color tone can be achieved easily by the content of the second fluorescent material being 10 phr or more. In addition, the color reproducibility and the color rendering property can be improved. Furthermore, it becomes easy to put the second fluorescent material between the first resin layer 30 and the light emitting element 20 so that the conduction of the heat generated in the light emitting element 20 to the first fluorescent material can be suppressed. When the content of the second fluorescent material is 20 phr or more, the above-mentioned effects are further enhanced. The second resin layer can be formed easily by the content of the second fluorescent material being 60 phr or less. Preferably, the second fluorescent material is evenly-distributed in the second resin layer 40. The light emission of the light emitting device 100 can be adjusted to uniform color tone by the even distribution of the second fluorescent material.

Preferably, the second resin layer 40 does not substantially comprise the first fluorescent material. Occurrence of the loss of light caused by the absorption of a part of the light emitted from the second fluorescent material into the first fluorescent material can be suppressed by the second resin layer 40 not substantially comprising the first fluorescent material. Furthermore, the degradation of the first fluorescent material due to moisture which can penetrate from the external environment can be effectively suppressed.

The second resin layer 40 is arranged on the surface of the base 10 (the bottom surface 15a of the concave portion 15). The second resin layer 40 is present at least on the top of the light emitting element 20, on the top of the first resin layer 30, and in the area between the light emitting element 20 and the first resin layer 30. The degradation of the first fluorescent material contained in the first resin layer 30 due to heat, light and moisture can be suppressed by the arrangement of the second resin layer 40 in this manner. The second resin layer 40 may be arranged to cover the light emitting element 20 and the first resin layer 30 as shown in FIG. 1B and FIG. 1C.

The second resin layer 40 preferably contacts with the sidewall surface 15b of the concave portion 15. This allows the second resin layer 40 to be arranged between the first resin layer 30 and the external environment, and thus, the degradation of the first fluorescent material due to moisture can be prevented. The thickness of the second resin layer 40 from the upper surface of the first resin layer 30 is preferably decreased from the side close to the center of the concave portion 15 toward the sidewall surface 15b. Such configuration allows the second fluorescent material exhibiting relatively-high heat resistance to be present adjacent to the light emitting element 20, and thus, the degradation of the first fluorescent material exhibiting relatively-low heat resistance due to heat can be suppressed. In addition, the thickness of the second resin layer 40 is preferably thicker than the thickness of the first resin layer 30 at the side close to the center of the concave portion 15, and the thickness of the second resin layer 40 is preferably thinner than the thickness of the first resin layer 30 at the side close to the sidewall surface 15b of the concave portion 15. Furthermore, relative thickness of the second resin layer 40 to the first resin layer 30 is preferably decreased from the side close to the center of the concave portion 15 toward the sidewall surface 15b. The degradation of the first fluorescent material due to heat can also be suppressed by these configurations.

The thickness of the second resin layer 40 at the upper end of the first resin layer 30 is preferably 1000 µm or less. By the thickness of the second resin layer 40 at the upper end of the first resin layer 30 being 1000 µm or less, the effects of absorption and scattering by the resin layer can be suppressed, and the light can be extracted easily. The thickness of the second resin layer 40 may be zero at the upper end of the first resin layer 30. That is, the second resin layer 40 may not be present at the upper end of the first resin layer 30, and the upper end of the first resin layer 30 may be exposed. However, the second resin layer 40 is preferably present at the upper end of the first resin layer 30, and the thickness of the second resin layer 40 at the upper end of the first resin layer 30 is more preferably 10 µm or more. The degradation of the first fluorescent material in the first resin layer 30 due to moisture which can penetrate from the external environment can be suppressed effectively by the thickness of the second resin layer 40 being 10 µm or more.

Preferably, the light emitting device 100 further comprises a third resin layer which is arranged on the second resin layer 40, comprises a light transmissive resin and does not substantially comprise any one of the first and the second fluorescent materials. The degradation of the first fluorescent material due to moisture which can penetrate from the external environment can be further suppressed by the light emitting device 100 comprising the third resin layer, and in addition, the degradation of the second fluorescent material due to moisture can also be suppressed. As the light transmissive resin in the third resin layer, similar resins to the light transmissive resins usable in the first resin layer 30 and the second resin layer 40 described above can be used. The thickness of the third resin layer is preferably from 10 µm to 500 µm, more preferably from 10 µm to 300 µm. The degradation of the first and the second fluorescent materials due to moisture can be suppressed more effectively by the thickness of the third resin layer being 10 µm or more. The effects of absorption and scattering by the third resin layer can be suppressed by the thickness of the third resin layer being 500 µm or less. The effects of absorption and scattering by the third resin layer can be further suppressed by the thickness of the third resin layer being 300 µm or less.

Figure 3:
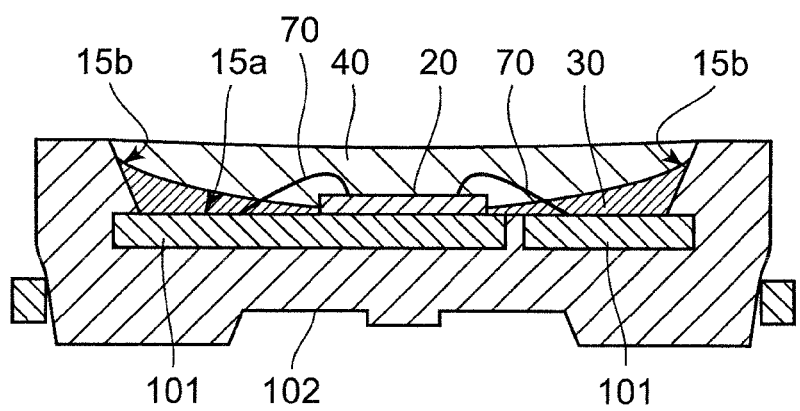
FIG. 3 shows a schematic cross-sectional view of the first modified example of the light emitting device according to the first embodiment of the present invention.

Then, a first modified example of the first embodiment will be described below. FIG. 3 is a schematic cross-sectional view of the first modified example of the light emitting device according to the first embodiment. In this modified example, the first resin layer 30 is arranged to surround the side portion of the light emitting element 20, and the second resin layer 40 is present at least on the top of the light emitting element 20 and on the top of the first resin layer 30. The first fluorescent material contained in the first resin layer 30 is arranged on the sidewall side of the concave portion 15 in larger amount than on the side of the light emitting element 20. In order to arrange the first fluorescent material in this manner, the height (the thickness) of the first resin layer 30 from the bottom surface 15a of the concave portion 15 is preferably increased from the side close to the center of the concave portion 15 toward the sidewall surface 15b. By the arrangement of the first fluorescent material on the sidewall side of the concave portion 15 in larger amount than on the side of the light emitting element 20, the degradation of the first fluorescent material due to heat can be suppressed even when the first resin layer 30 contacts with the side portion of the light emitting element 20 as shown in FIG. 3.

Figure 4A:
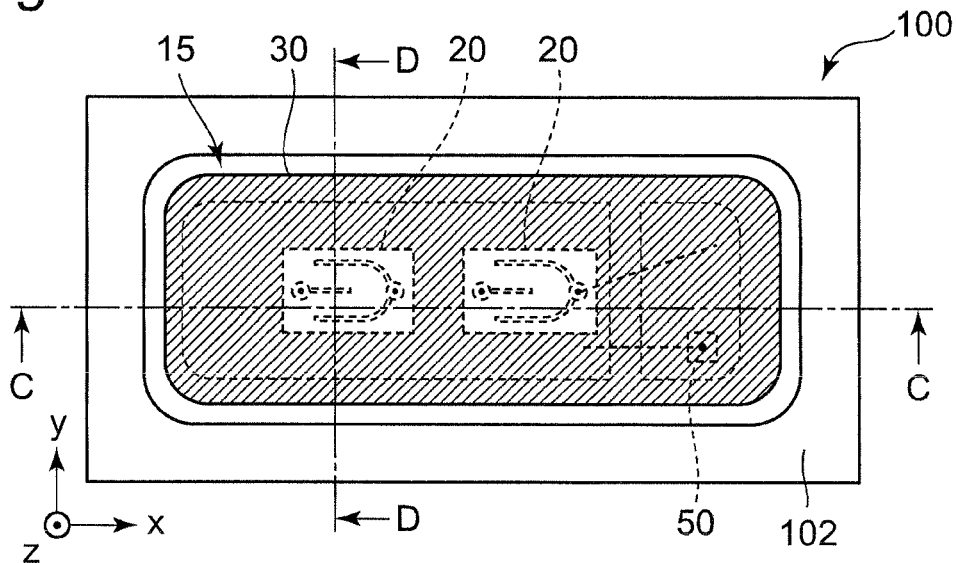
FIG. 4A shows a schematic top view of the second modified example of the light emitting device according to the first embodiment of the present invention.
Figure 4B:
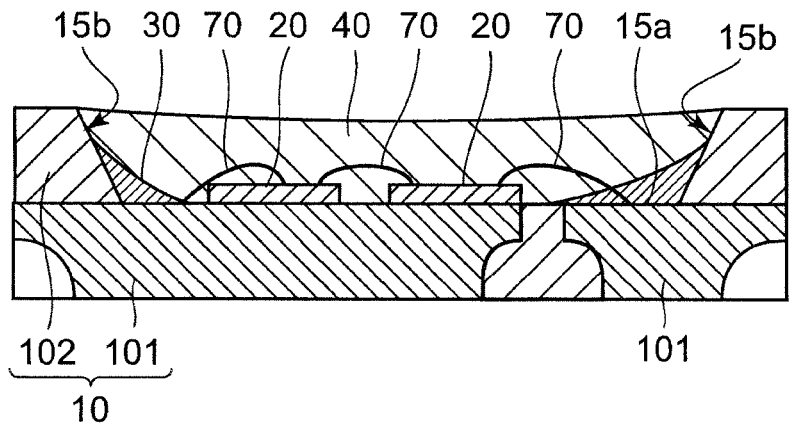
FIG. 4B shows a schematic cross-sectional view along a line C-C in FIG. 4A.
Figure 4C:
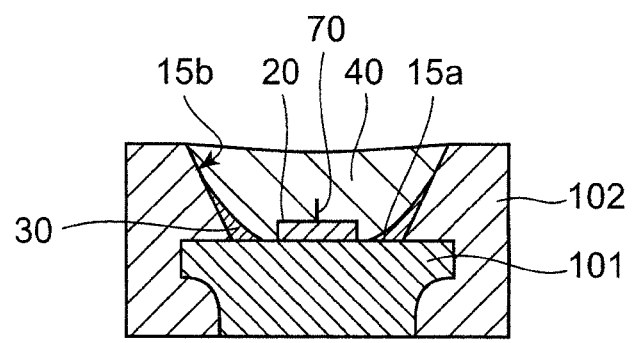
FIG. 4C shows a schematic cross-sectional view along a line D-D in FIG. 4A.

Then, a second modified example of the first embodiment will be described below. FIG. 4A is a schematic top view of the second modified example of the light emitting device according to the first embodiment, FIG. 4B is a schematic cross-sectional view along a line C-C in FIG. 4A, and FIG. 4C is a schematic cross-sectional view along a line D-D in FIG. 4A.

In this modified example, a plurality of light emitting elements 20 are arranged on the surface of the base 10. In FIGS. 4A-C, two light emitting elements 20 are arranged for illustrative purpose. The light emitting elements 20 are respectively attached to the bottom surface 15a of the concave portion 15 with the adhesive, and electrically-connected to the lead frames 101 by the wires 70. In addition, the plurality of light emitting elements 20 are connected in series to each other by the wires 70. In this modified example, the light emitting device 100 is provided with a protection element 50. The protection element 50 is mounted on a lead frame, of the pair of the lead frames 101, different from a lead frame on which the light emitting element 20 is mounted. The distance between the light emitting element 20 and the protection element 50 can be increased by the arrangement of the protection element 50 in this manner, and as a result, a loss caused by the absorption of the primary light emitted from the light emitting element 20 into the protection element 50 can be suppressed.

Even when the plurality of the light emitting elements 20 are arranged on the base 10 in this manner, a light emitting device exhibiting excellent heat resistance, light resistance and moisture resistance, and exhibiting good color reproducibility can be obtained by similar arrangement of the first resin layer 30 and the second resin layer 40. Preferably, the first resin layer 30 comprising the first fluorescent material is not present in the area between the adjacent light emitting elements 20 in this modified example. The contact of the first resin layer 30 with the light emitting elements 20 can be suppressed by such configuration.

Then, one example of a method for manufacturing the light emitting device 100 according to the first embodiment of the present application will be described with reference to the drawings. FIGS. 5A-5E are schematic cross-sectional views showing steps (a)-(e) in one example of the method for manufacturing the light emitting device 100 according to the first embodiment. The method for manufacturing the light emitting device 100 according to the first embodiment is required to comprise at least a step for forming the first resin layer 30 and the second resin layer 40 on the base 10 on which the light emitting element 20 is mounted, and the method for manufacturing the light emitting device 100 according to the first embodiment is not limited to the manufacturing method described herein.

The base 10 used in the present example refers to an aggregate base with a plurality of the bases 10 connected to each other which is obtained by forming a plurality of moldings 102 by means of a mold(s) on a plate-like member comprising a plurality of lead frames 101 connected to each other.

Figure 5A:
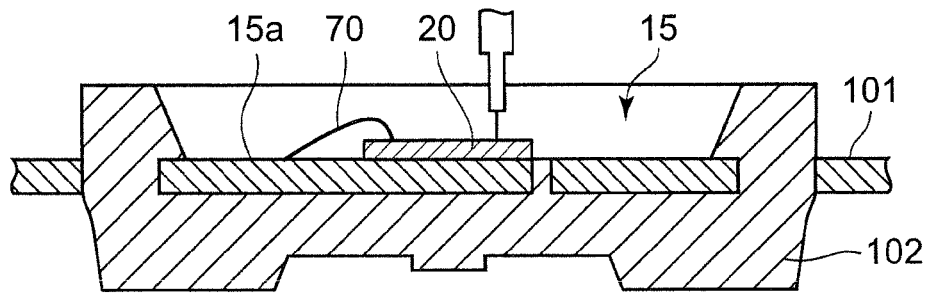
FIGS. 5A-5E show schematic cross-sectional views for the explanation of a method for manufacturing the light emitting device according to the first embodiment of the present invention.

The step (a) shown in FIG. 5A is a step for mounting the light emitting element 20. In the step (a), the light emitting element 20 is mounted on the base 10. In this example, the light emitting element 20 is secured with the adhesive on the bottom surface 15a of the concave portion 15 in the base 10, and electrically-connected to the lead frames 101 (or the interconnections 121 described below). In this example, the light emitting element 20 is mounted in a face-up manner, and connected to the lead frames 101 by the wires.

Figure 5B:
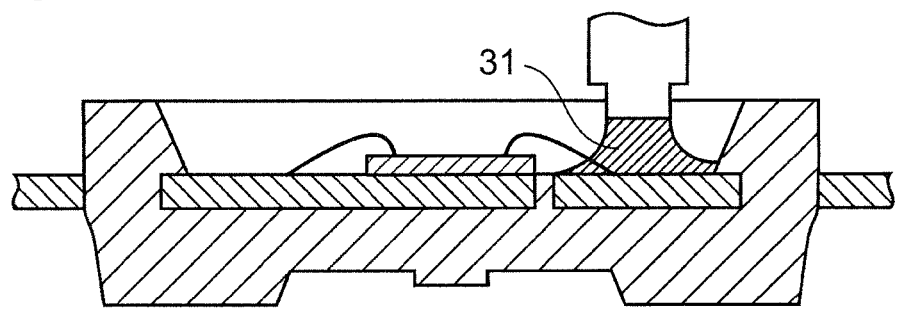
Figure 5C:
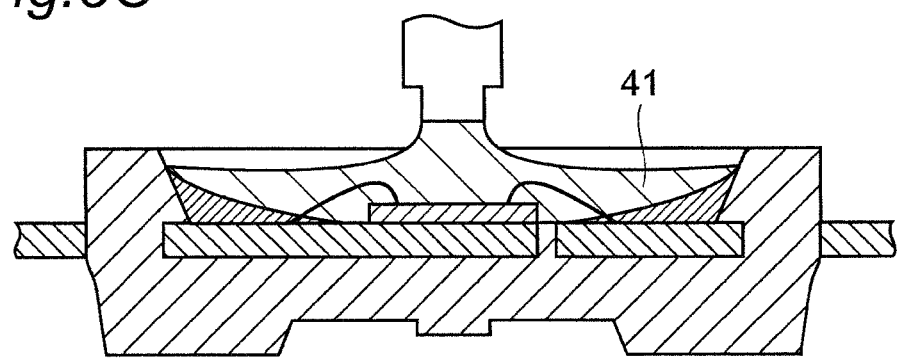
Figure 5D:
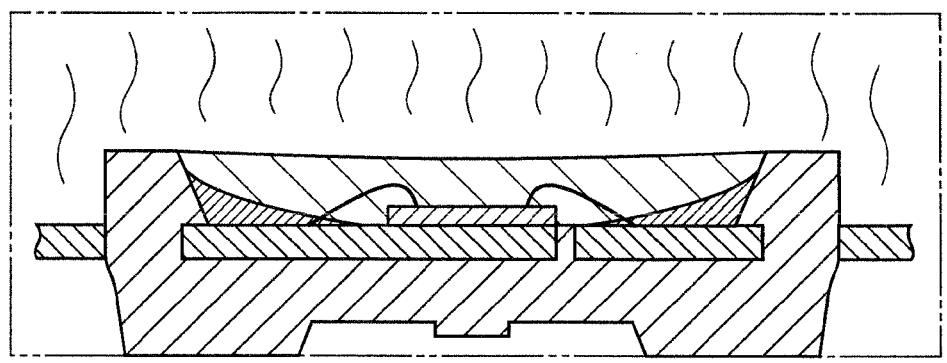

The steps (b) to (d) shown in FIGS. 5B-5D are steps for forming the first resin layer 30 and the second resin layer 40. The first resin layer 30 and the second resin layer 40 are formed by dropping (potting) materials having flowability such as liquid materials, sol materials or slurry materials on the bottom surface 15a of the concave portion 15 by use of a dispenser and the like, and then by solidifying them. Hereinafter, a flowable material comprising the light transmissive material and the first fluorescent material to be a raw material for the first resin layer 30 is referred to as a first flowable material 31, and a flowable material comprising the light transmissive material and the second fluorescent material to be a raw material for the second resin layer 40 is referred to as a second flowable material 41.

Firstly, in the step (b) shown in FIG. 5B, the first flowable material 31 is dropped on the surface of the base (in the present example, the bottom surface 15a of the concave portion 15). In the step, dropping the first flowable material 31 at a vicinity of the sidewall surface 15b of the concave portion 15 allows the first flowable material 31 to accumulate along the sidewall surface 15b, and thus, the first flowable material 31 can be arranged to be spaced apart from the light emitting element 20. Additives such as fillers may be added to the first flowable material 31 and the second flowable material 41 described below for the adjustments of viscosities and the flowabilities of the first flowable material 31 and the second flowable material 41.

Then, in the step (c) shown in FIG. 5C, the second flowable material 41 is dropped on the surface of the base (in the present example, the bottom surface 15a of the concave portion 15). In the step, it is preferable to drop the second flowable material 41 directly above the light emitting element 20. When the first flowable material 31 comprising the first fluorescent material is present directly above the light emitting element 20, the first flowable material 31 can be moved to the lateral side of the light emitting element 20 by the dropping in this manner. Alternatively, the first flowable material 31 can be moved to the lateral side of the light emitting element 20 by spraying gases such as air on the upper surface of the light emitting element 20 after the dropping of the first flowable material 31.

After the step (c), in some cases, the second fluorescent material contained in the second flowable material 41 can be sedimented to a side of the surface of the base 10 (the bottom surface 15a of the concave portion 15) by subjecting the base 10 to centrifugal sedimentation treatment.

Finally, in the step (d) shown in FIG. 5D, the dropped first flowable material 31 and second flowable material 41 is solidified by heating, cooling or the like.

Figure 5E:
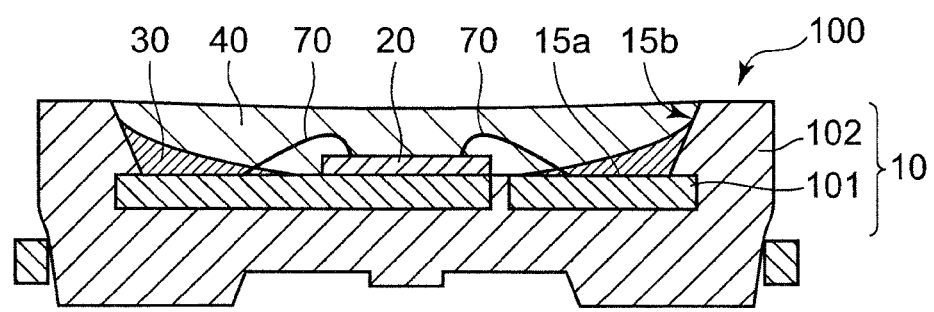

The step (e) shown in FIG. 5E is a step for singulating the light emitting device 100. Specifically, the plate-like member of the aggregate base is cut off, and the terminal areas of the lead frames 101 are formed into the predetermined shape (cut and forming) to obtain the individual light emitting devices 100.

Second Embodiment

Figure 6A:
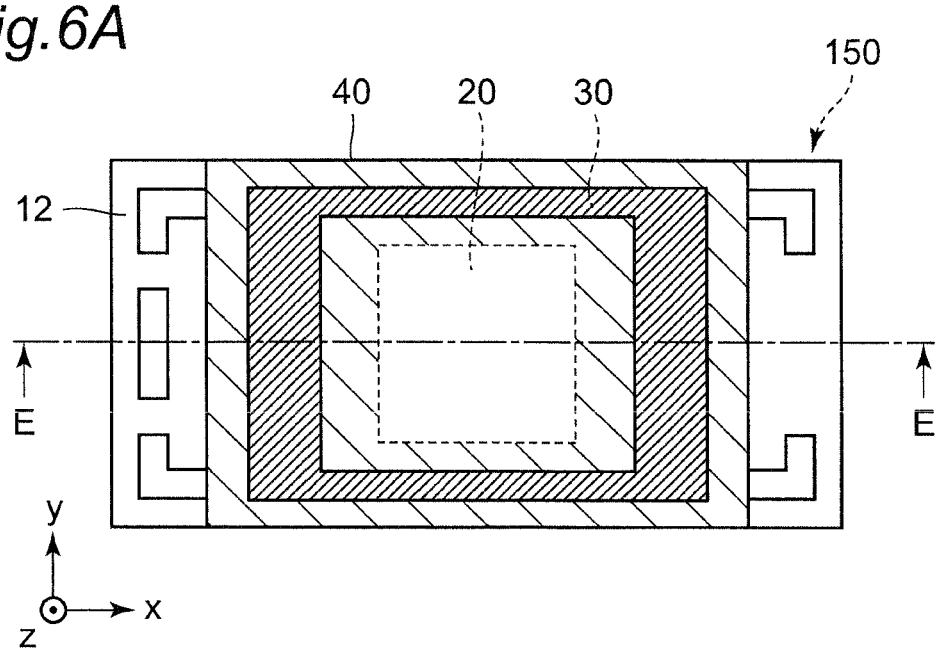
FIG. 6A shows a schematic top view of a light emitting device according to the second embodiment of the present invention.
Figure 6B:
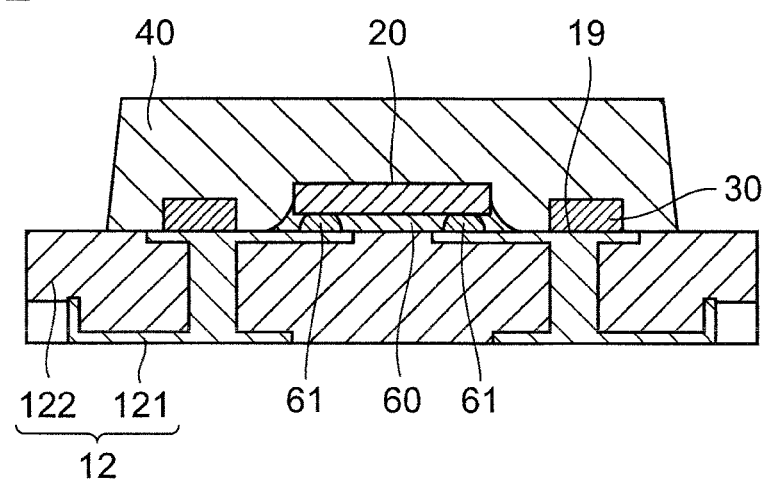
FIG. 6B shows a schematic cross-sectional view along a line E-E in FIG. 6A.

A light emitting device 150 according to a second embodiment of the present invention will be described below with reference to the drawings. FIG. 6A is a schematic top view of the light emitting device according to the second embodiment of the present invention, and FIG. 6B is a schematic cross-sectional view along a line E-E in FIG. 6A. Hereinafter, the explanations shall be made with a focus on different points with the first embodiment, and similar explanations to those of the first embodiment will apply to this embodiment unless otherwise specified.

In the present embodiment, the light emitting device 150 comprises a base 12, a light emitting element 20, a first resin layer 30 comprising a first fluorescent material and a second resin layer 40 comprising a second fluorescent material.
(Base 12)

The base 12 is a wiring substrate comprising a pair of positive and negative interconnections 121 and a substrate 122 for holding the interconnections 121. The base 12 is in the form of plate, and has no concave portion 15. The upper surface of the base 12 is composed of the surface of the interconnections 121 and the surface of the substance 122.

(Interconnection 121)

The interconnections 121 are formed at least on the upper surface of the base 12, and may be formed on the inside, the lower surface and the side surfaces of the base 12. In addition, the interconnections 121 may have a land (die pad) section(s) for the light emitting element 20 bonded thereon, a terminal area(s) for external connection, extensive wirings for connecting them and the like. A material for the interconnections includes copper, nickel, palladium, tungsten, chromium, titanium, aluminum, silver, gold or alloys thereof. A coat of silver, platinum, tin, gold, copper, rhodium or alloys thereof, or silver oxide or oxides of silver alloys may be formed on the surface of the interconnections 121.

(Substrate 122)

The substrate 122 may be electrically-insulating. Even when the substrate 122 is electrically-conductive, the substrate 122 can be electrically insulated from the interconnections 121 by the intervention of insulating film or the like. The substrate 122 may be formed of ceramics comprising aluminum oxide, aluminum nitride, zirconium oxide, zirconium nitride, titanium oxide, titanium nitride or mixtures thereof, metals comprising copper, iron, nickel, chromium, aluminum, silver, gold, titanium or alloys thereof, resins such as epoxy resins, BT resins, polyimide resins or fiber-reinforced resins thereof, or flexible board.

The light emitting element 20 is arranged on the surface of the base 12. In the present embodiment, the light emitting element 20 is arranged on the upper surface of the base 12. As shown in FIG. 6B, the light emitting element 20 is electrically-connected to the interconnections 121 via conductive adhesives 61. As the conductive adhesives, adhesives usable in the first embodiment as described above can be used similarly.

As shown in FIG. 6B, the upper surface and all of the side surfaces of the second resin layer 40 is exposed to the external environment. Such configuration can reduce members blocking the light emitted from the light emitting element 20 and the fluorescence emitted from the first fluorescent material and the second fluorescent material in all directions above the light emitting device, and the light can be extracted efficiently to the outside of the light emitting device 150. In addition, the light can be emitted to a large area above the light emitting device 150, and as a result, wide light distribution can be achieved. In addition, one pair in the two pairs of the side surfaces of the second resin layers 40 facing each other may be present on substantially the same plane as the side surface of the base 12. Such shape can be obtained by installing a detachable frame body onto the base 12, and then cutting the second resin layer 40 formed within the frame on the base 12 together with the base 12. The surface of the second resin layer 40 may have a curved surface shape in order to improve the light extraction efficiency, and may have a shape obtained by cutting off a part of circular cylinder, such as semi-cylindrical shape, for example.

An underfill 60 is provided between the upper surface 19 of the base 12 and the light emitting element 20. The underfill 60 is preferably composed of a light reflective material. With this arrangement the primary light emitted from the light emitting element 20 can be reflected upwardly and the light loss due to the base 12 can be suppressed so that the light extraction efficiency can be improved. The underfill 60 may cover the side surface of the light emitting element 20. However, in order to obtain the secondary light by the fluorescent material present laterally to the light emitting element 20, the underfill 60 is preferably provided such that at least part of the side surface of the light emitting element 20 is exposed, in other words, such that the second resin layer 40 covers at least part of the side surface of the light emitting element 20. The underfill 60 may be formed of a light transmissive resin usable in the first resin layer and the second resin layer. For example, the underfill 60 can be composed of white resins such as silicone resins comprising titanium oxide particles, for example.

Also in the present embodiment, the first resin layer 30 comprising the first fluorescent material is arranged on the surface of the base 12 to surround the side portion of the light emitting element 20 and to be spaced apart from the side portion. In this embodiment, the first resin layer 30 can be formed by, for example, printing, spray coating or the like. When the spray coating is carried out, the spray coating can be carried out with masks provided on the positions other than the positions where the first resin layer 30 is to be formed. After the first resin layer 30 is formed, the second resin layer 40 comprising the second fluorescent material is arranged on the surface of the base 12. The second resin layer 40 is present at least on the top of the light emitting element 20, on the top of the first resin layer 30 and in the area between the light emitting element 20 and the first resin layer 30. In the present embodiment, the second resin layer 40 can be formed by, for example, printing, compression molding, transfer molding or the like.

With such configuration of the first resin layer 30 and the second resin layer 40, light emitting devices exhibiting excellent heat resistance and good color reproducibility.

In the present embodiment, the side surfaces of the first resin layer 30 contacts with the second resin layer 40 at both of inner and outer side surfaces of the first resin layer 30, and the second resin layer 40 contacts with the external environment at the upper surface and all of the side surfaces. The distance between the outer side surface of the first resin layer 30 and the side surface of the second resin layer 40 in a direction parallel to the surface of the base 12 is preferably from 5 μm to 1000 μm, more preferably from 10 μm to 800 μm. The degradation of the first fluorescent material due to moisture which can penetrate from the external environment can be suppressed by setting this distance to be 5 μm or more. The degradation due to moisture can be further suppressed by setting this distance to be 10 μm or more. In addition, a place with high (uneven) concentration of the second fluorescent material is not created by the setting this distance to be 1000 μm or less, and thus, the color reproducibility and the color rendering property can be kept in good conditions. The light emitting device exhibiting further better color reproducibility and color rendering property can be obtained by setting the distance to be 800 μm or less.

As described above, the light emitting device according to the embodiments of the present invention can provide a light emitting device exhibiting excellent heat resistance and good color reproducibility.

INDUSTRIAL APPLICABILITY

The light emitting device according to embodiments of the present invention can be used for light sources of backlights in liquid crystal displays, various lighting equipment, large-sized displays, various display devices for advertisings, guidance and the like, digital video cameras, facsimiles, copying machines, image reading apparatuses in scanners and the like, projector equipment and the like.

REFERENCE SIGNS LIST 100, 150 Light emitting device
10, 12 Base
101 Lead frame
102 Molding
121 Interconnection
122 Substrate
15 Concave portion
15a Bottom surface of concave portion
15b Sidewall surface of concave portion
19 Upper surface of base
20 Light emitting element
30 First resin layer
40 Second resin layer
50 Protection element
60 Underfill
61 Conductive adhesive
70 Wire
81 Light (secondary light) emitted from first fluorescent material
82 Light (secondary light) emitted from second fluorescent material

What is claimed is:

1. A light emitting device comprising:
a base;
a light emitting element arranged on a surface of the base;
a first resin layer arranged on the surface of the base to surround a side portion of the light emitting element and to be spaced apart from the side portion of the light emitting element, the first resin layer not being exposed to an external environment at an upper surface of the light emitting device; and
a second resin layer arranged on the surface of the base,
wherein the second resin layer is in contact with at least an upper surface of the light emitting element and an entirety of an uppermost surface of the first resin layer,
wherein the second resin layer is disposed in an area between the light emitting element and the first resin layer,
wherein the first resin layer comprises a light transmissive resin and a first fluorescent material that is excitable by at least part of light emitted by the light emitting element to emit light,
wherein the second resin layer comprises a light transmissive resin and a second fluorescent material that is excitable by at least part of light emitted by the light emitting element to emit light, and
wherein the second fluorescent material exhibits higher heat resistance than that of the first fluorescent material.

2. A light emitting device comprising:
a base having a concave portion;
a light emitting element arranged on a bottom surface of the concave portion;
a first resin layer arranged on the bottom surface to surround a side portion of the light emitting element, the first resin layer not being exposed to an external environment at an upper surface of the light emitting device; and
a second resin layer arranged on a surface of the base,
wherein the second resin layer is in contact with at least an upper surface of the light emitting element and an entirety of an uppermost surface of the first resin layer,
wherein the first resin layer comprises a light transmissive resin and a first fluorescent material that is excitable by at least part of light emitted by the light emitting element to emit light,
wherein the second resin layer comprises a light transmissive resin and a second fluorescent material that is excitable by at least part of light emitted by the light emitting element to emit light,
wherein the first fluorescent material is arranged on a sidewall side of the concave portion in larger amount than on a side of the light emitting element, and
wherein the second fluorescent material exhibits higher heat resistance than that of the first fluorescent material.

3. The light emitting device according to claim 1, wherein an emission wavelength of the second fluorescent material overlaps at least partly with an absorption spectrum of the first fluorescent material.

4. The light emitting device according to claim 1, wherein the light emitting element is a blue light emitting element, wherein the first fluorescent material is a red fluorescent material, and wherein the second fluorescent material is a green fluorescent material and/or a yellow fluorescent material.

5. The light emitting device according to claim 4, wherein the second fluorescent material comprises the green fluorescent material.

6. The light emitting device according to claim 5, wherein the green fluorescent material is one or more fluorescent materials selected from the group consisting of chlorosilicate fluorescent materials and β-sialon fluorescent materials.

7. The light emitting device according to claim 4, wherein the red fluorescent material is one or more fluorescent materials selected from the group consisting of SCASN-based fluorescent materials, CASN-based fluorescent materials and KSF-based fluorescent materials.

8. The light emitting device according to claim 7, wherein the red fluorescent materials are $K_2SiF_6$:Mn fluorescent materials.

9. The light emitting device according to claim 4, wherein the second fluorescent material comprises the yellow fluorescent material, the yellow fluorescent material being one or more fluorescent materials selected from the group consisting of YAG-based fluorescent materials and LAG-based fluorescent materials.

10. The light emitting device according to claim 1, wherein the first resin layer does not substantially comprise the second fluorescent material, and wherein the second resin layer does not comprise the first fluorescent material.

11. The light emitting device according to claim 1, wherein a distance between the light emitting element and the first resin layer in a direction parallel to the surface of the base is from 10 µm to 1000 µm.

12. The light emitting device according to claim 1, wherein a height of an upper end of the first resin layer from the surface of the base is less than or equal to a height of an upper end of the light emitting element from the surface of the base.

13. The light emitting device according to claim 12, wherein the light emitting element comprises a light-transmissive substrate and semiconductor layers laminated on the light-transmissive substrate, wherein the semiconductor layers comprise a luminescent layer, and wherein a height of an upper end of the first resin layer from the surface of the base is less than or equal to a height of a lower end of the luminescent layer from the surface of the base.

14. The light emitting device according to claim 13, wherein a height of the upper end of the first resin layer from the surface of the base is less than or equal to a height of an upper end of the substrate from the surface of the base.

15. The light emitting device according to claim 1, wherein a thickness of the second resin layer at the upper end of the first resin layer is 1000 µm or less.

16. The light emitting device according to claim 1, further comprising a third resin layer arranged on the second resin layer, the third resin layer comprising a light transmissive resin and not substantially comprising the any one of the first and the second fluorescent materials.

17. The light emitting device according to claim 2, wherein an emission wavelength of the second fluorescent material overlaps at least partly with an absorption spectrum of the first fluorescent material.

18. The light emitting device according to claim 2, wherein the light emitting element is a blue light emitting element, wherein the first fluorescent material is a red fluorescent material, and wherein the second fluorescent material is a green fluorescent material and/or a yellow fluorescent material.

19. The light emitting device according to claim 18, wherein the second fluorescent material comprises the green fluorescent material.

20. The light emitting device according to claim 19, wherein the green fluorescent material is one or more fluorescent materials selected from the group consisting of chlorosilicate fluorescent materials and β-sialon fluorescent materials.

21. The light emitting device according to claim 18, wherein the red fluorescent material is one or more fluorescent materials selected from the group consisting of SCASN-based fluorescent materials, CASN-based fluorescent materials and KSF-based fluorescent materials.

22. The light emitting device according to claim 21, wherein the red fluorescent materials are $K_2SiF_6$:Mn fluorescent materials.

23. The light emitting device according to claim 18, wherein the second fluorescent material comprises the yellow fluorescent material, the yellow fluorescent material being one or more fluorescent materials selected from the group consisting of YAG-based fluorescent materials and LAG-based fluorescent materials.

24. The light emitting device according to claim 2, wherein the first resin layer does not substantially comprise the second fluorescent material, and wherein the second resin layer does not substantially comprise the first fluorescent material.

25. The light emitting device according to claim 2, wherein a distance between the light emitting element and the first resin layer in a direction parallel to the surface of the base is from 10 µm to 1000 µm.

26. The light emitting device according to claim 2, wherein a height of an upper end of the first resin layer from the surface of the base is less than or equal to a height of an upper end of the light emitting element from the surface of the base.

27. The light emitting device according to claim 26, wherein the light emitting element comprises a light-transmissive substrate and semiconductor layers laminated on the light-transmissive substrate, wherein the semiconductor layers comprise a luminescent layer, and wherein a height of an upper end of the first resin layer from the surface of the base is less than or equal to a height of a lower end of the luminescent layer from the surface of the base.

28. The light emitting device according to claim 27, wherein a height of the upper end of the first resin layer from the surface of the base is less than or equal to a height of an upper end of the substrate from the surface of the base.

29. The light emitting device according to claim 2, wherein a thickness of the second resin layer at the upper end of the first resin layer is 1000 µm or less.

30. The light emitting device according to claim 2, further comprising a third resin layer arranged on the second resin layer, the third resin layer comprising a light transmissive resin and not substantially comprising the any one of the first and the second fluorescent materials.

* * * * *